(12) United States Patent
Baker et al.

(10) Patent No.: US 10,577,744 B2
(45) Date of Patent: Mar. 3, 2020

(54) FABRIC WITH CONTAMINANT RESISTANT NANOPARTICLE COATING AND METHOD OF IN SITU APPLICATION

(71) Applicant: AstenJohnson, Inc., Charleston, SC (US)

(72) Inventors: Samuel M. Baker, Carleton Lake (CA); Rex Barrett, Neenah, WI (US); Bud J. Chase, Sherwood, WI (US); Bruce W. Janda, Appleton, WI (US); Ian Gerald Lang, Almonte (CA); Dietmar Wirtz, Simmerath (DE); Larry Anderson, Appleton, WI (US)

(73) Assignee: AstenJohnson, Inc., Charleston, SC (US)

( * ) Notice: Subject to any disclaimer, the term of this patent is extended or adjusted under 35 U.S.C. 154(b) by 141 days.

(21) Appl. No.: 15/425,031

(22) Filed: Feb. 6, 2017

(65) Prior Publication Data
US 2017/0145626 A1 May 25, 2017

Related U.S. Application Data

(60) Continuation of application No. 12/873,359, filed on Sep. 1, 2010, now Pat. No. 9,562,319, which is a division of application No. 11/371,970, filed on Mar. 9, 2006, now Pat. No. 7,811,627.

(60) Provisional application No. 60/659,799, filed on Mar. 9, 2005.

(51) Int. Cl.
| | | |
|---|---|---|
| D06M 13/08 | (2006.01) | |
| D06M 13/53 | (2006.01) | |
| D06M 23/08 | (2006.01) | |
| B82Y 30/00 | (2011.01) | |
| D06M 23/16 | (2006.01) | |
| D21F 1/00 | (2006.01) | |
| D21F 1/30 | (2006.01) | |
| D21F 1/32 | (2006.01) | |

(52) U.S. Cl.
CPC .......... *D06M 23/08* (2013.01); *B82Y 30/00* (2013.01); *D06M 13/08* (2013.01); *D06M 13/53* (2013.01); *D06M 23/16* (2013.01); *D21F 1/0027* (2013.01); *D21F 1/30* (2013.01); *D21F 1/32* (2013.01); *Y10S 162/90* (2013.01); *Y10S 162/901* (2013.01); *Y10S 162/902* (2013.01); *Y10S 162/903* (2013.01); *Y10T 428/25* (2015.01); *Y10T 442/20* (2015.04); *Y10T 442/2279* (2015.04)

(58) Field of Classification Search
CPC ...... D06M 13/08; D06M 13/53; D06M 23/08; D06M 23/16; D21F 1/32; D21F 1/30; D21F 1/0027; B82Y 30/00; Y10T 442/20; Y10T 442/2279; Y10T 428/25; Y10S 162/901; Y10S 162/90; Y10S 162/902; Y10S 162/903
See application file for complete search history.

(56) References Cited

U.S. PATENT DOCUMENTS

| | | |
|---|---|---|
| 2,943,955 A | 7/1960 | Brill |
| 4,728,530 A | 3/1988 | Waldvogel et al. |
| 5,207,873 A | 5/1993 | Sanduja et al. |
| 6,050,392 A | 4/2000 | Straub |
| 6,132,920 A | 10/2000 | Hagi et al. |
| 6,464,672 B1 | 10/2002 | Buckley |
| 6,482,525 B1 | 11/2002 | Kasemann et al. |
| 6,607,994 B2 | 8/2003 | Soane et al. |
| 6,616,814 B2 | 9/2003 | Best |
| 6,620,514 B1 | 9/2003 | Arpac et al. |
| 6,629,070 B1 | 9/2003 | Nagasaki |
| 6,649,266 B1 | 11/2003 | Gross et al. |
| 6,712,932 B2 | 3/2004 | Buchsel et al. |
| 6,743,273 B2 | 6/2004 | Chung et al. |
| 6,962,885 B1 | 11/2005 | Best |
| 7,166,196 B1 | 1/2007 | Kramer et al. |
| 7,413,633 B2 | 8/2008 | Li et al. |
| 2002/0060052 A1 | 5/2002 | Best |
| 2004/0170822 A1 | 9/2004 | Rohrbaugh et al. |
| 2004/0234718 A1 | 11/2004 | Hawes |
| 2004/0250969 A1 | 12/2004 | Luu et al. |

FOREIGN PATENT DOCUMENTS

| | | |
|---|---|---|
| BE | 611045 | 3/1962 |
| EP | 0576115 | 12/1993 |
| EP | 0969143 | 1/2000 |
| EP | 1010806 | 6/2000 |
| FR | 1358391 | 4/1964 |

(Continued)

*Primary Examiner* — Cheng Yuan Huang
(74) *Attorney, Agent, or Firm* — Volpe and Koenig, P.C.

(57) ABSTRACT

A fabric is treated by applying a nanoparticle type coating to improve their resistance to contamination by foreign matter. The coating is applied during fabric manufacture and cured during heat setting. Alternatively, the coating applied or renewed by utilizing an existing shower or locating a spray boom or other suitable coating application device to apply the coating to the fabric in a controlled, uniform manner. Prior to application of the coating, the fabric is first thoroughly cleaned such as by showering or spraying, and then dried. Following controlled application of the coating, any excess material is removed by a suitable means, such as by vacuum, and the remaining coating on the fabric is then cured, either by utilizing the ambient heat of the equipment or by a portable bank of heaters. In this manner, the fabric does not have to be removed from the machine in order to apply or renew the contaminant resistant coating.

8 Claims, 2 Drawing Sheets

(56) References Cited

FOREIGN PATENT DOCUMENTS

| | | |
|---|---:|---:|
| JP | 57171790 | 10/1982 |
| JP | 03221170 | 9/1991 |
| JP | 10245788 | 9/1998 |
| JP | 2000096476 | 4/2000 |
| JP | 2003096684 | 4/2003 |
| JP | 2006041894 | 2/2006 |
| JP | 2007292590 | 11/2007 |
| KR | 200396096 | 12/2003 |
| KR | 1020030096604 | 12/2003 |
| RU | 2104356 | 2/1998 |
| WO | 9905358 | 2/1999 |
| WO | 0250191 | 6/2002 |
| WO | 03014232 | 2/2003 |
| WO | 2004085727 | 10/2004 |
| WO | 2005090429 | 9/2005 |

FABRIC WITH CONTAMINANT RESISTANT NANOPARTICLE COATING AND METHOD OF IN SITU APPLICATION

CROSS-REFERENCE TO RELATED APPLICATIONS

This application is a continuation of U.S. application Ser. No. 12/873,259, filed Sep. 1, 2010, which is a divisional of U.S. application Ser. No. 11/371,970, filed Mar. 9, 2006, which claims the benefit of U.S. Provisional Application No. 60/659,799, filed Mar. 9, 2005, all of which are incorporated by reference as if fully set forth.

BACKGROUND

The present invention relates to methods for the in situ application of contaminant resistant coatings to fabrics, including papermaking fabrics, and papermaking fabrics so coated. In particular, the invention is directed to methods for the in situ application of nanoparticle coatings to papermaking fabrics that reduce machine down time.

Papermaking fabrics are used in connection with papermaking machines to both form an embryonic web of paper from a pulp slurry and to carry it through various dewatering and drying processes to form various types of paper products. The papermaking fabrics are generally in the form of a fine mesh, which can be of various woven and non-woven configurations depending on the position in the papermaking machine, and may include additional layers of batt, for example in certain press and dryer fabrics.

Particles suspended in the primarily cellulose fiber stock used to form the paper may include pitches, adhesives, other glue-like substances as well as other materials that have a propensity to stick to the papermaking fabrics, reducing the fabric permeability and adversely effecting the performance of the papermaking fabric. Prior known solutions to address this problem have proposed coating the fabric with an anti-contaminant material in order to enhance the anti-sticking property of the fabric and maintain the fabric cleaner for a longer period of time after it is installed on a papermaking machine. However, the prior known coatings wear off through use, resulting in diminished performance of the papermaking fabric. Additionally, the thickness of the coating itself had to be very small so that the coating itself did not reduce the fabric permeability.

While initial coatings had a fairly short life, one prior known anti-contaminant coating was developed containing polytetrafluoroethylene (PTFE) that was applied to the fabric using a bath and then cured at a temperature of 200° F. to 400° F. prior to installing the fabric on the papermaking equipment. This anti-contaminant coating had a longer life, but was still subject to wear.

Nanoparticle coatings are also known, such as described in e.g.: WO 02/50191 Solvent-Poor Sol-Gel Systems; U.S. Pat. No. 6,482,525 Method for producing thermoshaped substrates coated with a SOL-Gel Lacquer; U.S. Pat. No. 6,620,514 Nanostructured forms and layers and method for producing them; U.S. Pat. No. 6,607,994 Nanoparticle-Based permanent treatments for textiles; U.S. Pat. No. 6,649,266 Substrates produced with a microstructured surface; U.S. Pat. No. 6,629,070 Nanostructured moulded bodies; WO 03/014232A1 Material for producing abrasion proof hydrophobic and/or oleophobic coatings. The generally accepted definition of "nanoparticles" is particles with a size less than about 100 nm. Such coatings have been used in connection with various types of fabric, for example for contamination resistance or to increase wear life. However, they have not been specifically used in connection with papermaking fabrics In use, it is also known to remove papermaking fabrics having a substantial remaining useful life from a papermaking machine for re-coating and subsequent re-installation in order to maintain the benefit of anti-contaminant coatings. However, this entails substantial additional cost and down time for the papermaking machine.

Thus, it would be desirable if a contamination resistant nanoparticle coated papermaking fabric were available which provided anti-sticking properties when installed in the environment for which it is intended. It would be further desirable if methods existed to allow such fabrics, as well as those not so treated, to be coated or recoated with a either or both a hydrophobic or oleophobic contamination resistant nanoparticle coating while installed in the environment for which they are intended (i.e.: in situ application of the coating). It would also be desirable if methods existed which would allow for in situ application of the contamination resistant hydrophobic and/or oleophobic nanoparticle coating to selected areas only of these fabrics.

SUMMARY

A contaminant resistant industrial textile, such as a papermaking forming, dryer or Through-Air Drying (TAD) fabric, a filtration fabric, or fabrics used in other wet forming applications for different types of material or fibers and a method of rendering such a fabric contamination resistant is provided. In a first embodiment of the invention, which is presently preferred, a water based nanoparticle type contaminant resistant coating is applied to an industrial textile such as a papermaking fabric. The coating may have either, or both, hydrophobic or oleophobic characteristics, and is heat cured. This can be on the papermaking machine for in situ coated papermaking fabrics using existing heat sources which are already present in the papermaking equipment, or through the use of auxiliary heaters located adjacent to the fabric. Preferably, when the fabric is heat cured on the papermaking equipment, this is done at temperatures of between about 32° C. (90° F.) to about 120° C. (248° F.) by means of the existing heat source or the auxiliary heaters. All temperatures are as measured either immediately adjacent to, or at, the surface of the textile.

Alternatively, only selected portions of an industrial textile such as a papermaking fabric are treated with the water based nanoparticle type hydrophobic or oleophobic contaminant resistant coating. This can be while the fabric is installed in place on the papermaking machine (i.e. it is ready to run or is in operation, but not making paper). The coating is applied, for example, to the lateral side edges of the fabric only and those areas alone are subsequently heat cured in situ using existing heat sources already present in the papermaking equipment, or auxiliary heaters located adjacent to the fabric. Preferably, when the coating is cured in situ on the industrial textile, this is done at temperatures in the range of from about 32° C. (90° F.) to about 120° C. (248° F.).

In a second embodiment of the invention, the coating is applied to the textile after it has been manufactured, but prior to delivery to the customer for which it is intended. The coating is heat cured on the textile manufacturing equipment so as to bond it securely to the fabric, using temperatures which are in the range of from about 52° C. (125° F.), to about 204° C. (400° F.), all such temperatures being measured either immediately adjacent to, or at, the surface of the textile.

Preferably, the coating is heat cured prior to installation of the textile in the environment for which it is intended at temperatures of from about 66° C. (150° F.) to about 177° C. (350° F.); more preferably, the coating is heat cured prior to installation at a temperature of from about 66° C. (150° F.) to about 149° C. (300° F.).

Preferably, the entire surface area of the fabric is coated with the water based nanoparticle type contaminant resistant coating and is subsequently heat treated at temperatures of from about 52° C. (125° F.), to about 204° C. (400° F.), such temperatures being measured immediately adjacent to, or on, the textile surface. Alternatively, only selected portions of the textile surface are so treated and heat cured.

It is well known that many textile materials, including the PET (polyethylene terephthalate) yarn commonly used in the manufacture of papermaking fabrics, begin to lose their dimensional stability at elevated temperatures above about 93° C. (200° F.). If the entire fabric is to be exposed to temperatures greater than about 93° C. (200° F.) such as in a heatsetting process at the manufacturer's facilities, it is recommended that some means of dimensional stability control be applied so as to maintain certain dimensional and other physical properties of the fabric within desired ranges. One means of doing this is to restrain the fabric (i.e. apply lateral and/or longitudinal tension) by means of a tenter; however, other suitable means may be used without departing from the scope of the present invention.

In either or both of the first or second embodiment of the invention, the nanoparticle surface treatment preferably includes both a hydrophobic and oleophobic characteristic. However, effective results have been obtained by coating the fabric with a coating having only one of a hydrophobic or oleophobic characteristic. It is also possible to perform multiple coating and curing steps to form a composite coating on the fabric, for example, with a first coating layer having one of a hydrophobic or oleophobic characteristic, and a second or subsequent coating having the other of the hydrophobic or oleophobic characteristic, or another desired characteristic. This provides enhanced contamination resistance for the papermaking fabrics according to the invention.

In another aspect, the invention is also directed to papermaking fabrics having improved contamination resistance produced by the processes according to the invention. Such fabrics have a greatly improved Relative Contamination Resistance value in comparison to fabrics that have not been treated in accordance with the present invention.

BRIEF DESCRIPTION OF THE DRAWINGS

The present invention will be explained in more detail in connection with the drawings in which presently preferred embodiments are shown.

DETAILED DESCRIPTION OF THE PREFERRED EMBODIMENTS

Figure 1:
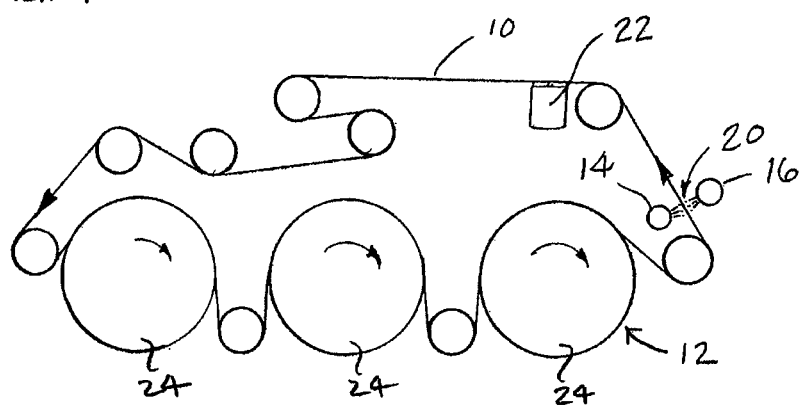
FIG. 1 is a side view, in schematic form, of a dryer section of a papermaking machine with a water based nanoparticle type hydrophobic or oleophobic contaminant resistant coating being applied to the fabric and cured on the machine in accordance with the present invention.

Certain terminology is used in the following description for convenience only and is not considered limiting. Words such as "front", "back", "top" and "bottom" designate directions in the drawings to which reference is made. This terminology includes the words specifically noted above, derivatives thereof and words of similar import. Additionally, the terms "a" and "one" are defined as including one or more of the referenced item unless specifically noted.

The term "tenter" as used herein refers to a device that stretches a textile to its finished width and straightens the weave by the action of two diverging endless chains each equipped with a series of pins, clips or clamps that hold the edges of the cloth and convey it over hot rolls or through a hot air box. It will be obvious to those of skill in the art that other suitable means may be employed so as to achieve the desired end result without departing from the spirit of the present invention.

All temperatures referenced herein in connection with heatsetting and curing the coated industrial textiles of this invention are measured at, or immediately adjacent to a surface of a textile by suitable means.

Figure 2:
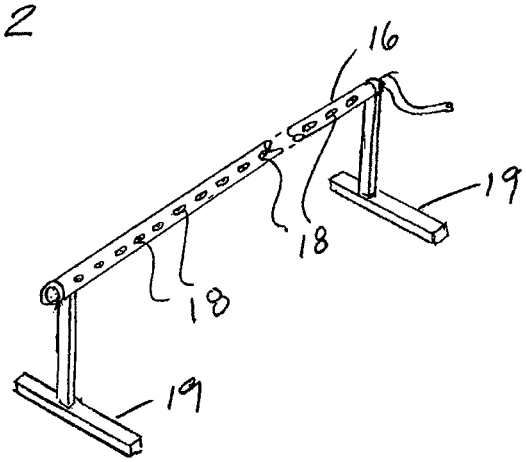
FIG. 2 is a perspective view of a spray boom that can be placed adjacent to the dryer fabric while it is on a papermaking machine in order to apply a nanoparticle type contaminant resistant coating in accordance with the present invention.

According to a first embodiment of the invention, the industrial textile, such as a through air-dryer ("TAD") fabric, forming fabric or dryer fabric 10, is first cleaned in place (i.e. in the forming or dryer section of a papermaking machine in its normal location), with the papermaking machine 12 moving the fabric 10 on a slow or "crawl" speed by showering, either with water or, optionally, water including a surfactant and/or pH adjustment as required. This helps to ensure that as much of any contaminants as have become attached to the fabric 10 during use are removed so that satisfactory bonding of the nanoparticle materials to the yarns of the fabric 10 in the subsequent fabric treatment occurs. The shower 14 is preferably an existing papermachine shower, but a portable spray boom 16, such as that shown in FIG. 2, or other suitable external cleaning system may be employed. A vacuum box 22 or other air treatment may be located on either or both of the paper side (PS) and machine side (MS) of the fabric following this cleaning shower so as to remove any excess water and/or cleaning fluids from the fabric and to dry it.

After the fabric 10 is cleaned and dried, a suitable hydrophobic and/or oleophobic nanoparticle type contaminant resistant liquid solution/suspension 20 can be applied to at least one fabric surface, preferably by coating roll application, spraying or showering it in liquid form onto the at least one surface. Preferably, this contaminant resistant liquid solution/suspension is a water-based three-component system consisting of:

1. an adhesion promoter,
2. nanoparticulate material comprised of an organic prepolymer, and
3. a fluorocarbon polymer.

Preferably, the adhesion promoter is an organofunctional adhesion promoter having a functional group which is one of a vinyl-, methacrylate-, epoxy-, amino-, or mercapto-group.

Preferably, the nanoparticulate material is comprised of organic nanoparticles such as nanowaxes including polyethylene or polypropylene, or prepolymers of condensated silanes such as methyltriethoxysilane, propyltriethoxysilane, octyltrimethoxysilane, octyltriethoxysilane, or phenyltrimethoxysilane and the like. An advantage provided by the use of the silane prepolymers is the possibility to react with the adhesion promoter to build a network of organic prepolymer.

Preferably, the fluorocarbon polymer is a fluoroacrylate or fluoroalkyl-polyurethane copolymer. Other similar fluorocarbon polymers may be suitable.

These three materials are combined in a ratio of from about 10-25% by weight adhesion promoter, 10-25% by weight nanoparticulate material, and from about 30-70% by weight fluorocarbon polymer to provide the desired three component system.

The coating can be applied by means of an existing shower 14 such as may already be located in the papermaking machine, as shown in FIG. 1. Alternatively, the coating 20 may be applied by appropriately locating a removable spray boom 16 or other suitable means through which the coating is applied to the fabric. The spray boom 16 preferably includes a plurality of spray nozzles 18, and is supported on legs 19 or may be clamped or is otherwise positionable adjacent to the fabric in a papermaking machine 12. The fabric 10 is coated in place (e.g. on location in the TAD dryer section) by using the selected coating device and without removing the fabric 10 from the machine Any excess coating material 20 is removed by a vacuum slot box 22 downstream of the application device and is recycled into the coating system.

Spray conditions and treatment times are calculated to yield efficient coverage of the papermachine fabric 10 and to ensure successful bonding of the nanoparticles to the yarns of the fabric 10. The speed of the fabric 10 and temperature of treatment are calculated to give the best possible coating integrity. Typical coating temperatures for a fabric unrestrained by a tenter in the cross machine direction are from about 32° C. (90° F.) to about 120° C. (248° F.). Typical applications are calculated to use about 23 g of active material per square meter of fabric surface. The material can be applied in a range of 0.5 to 30% active nano-solids in water dilution. Preferred active solids concentrations in use have been 2.5 to 10% solids. The excess amount is preferably removed with a vacuum slot downstream of the area where application occurs.

Fabrics which are very thick may require higher coating rates per unit area to completely cover the interior volume of the fabric. Fabric speeds of 2.5 to 4 meters per minute (8-12 feet per minute) are typical, but must be adjusted for the residence time in the heater zone to avoid over heating above the dimensional stability point of the yarn material (except in the case of final heatset in fabric manufacture where a tenter controls the dimensions of the fabric. The coating 20 is then cured, preferably by passing across the heated dryer rolls 24 of the dryer section of the papermaking machine 12, so as to ensure a good bond with the component yarns of the fabric 10.

The coating 20 can be optionally heat cured using a portable infrared heater bank 26 or the like, but it is preferably cured by means of heat derived from the dryer system of the machine, especially in a TAD, or through-air dryer section. It is believed that the TAD section of a tissue machine would be especially well suited to the application and curing of this coating 20 as there is sufficient heat of at least 49° C. (120° F.) to cause the coating 20 to cure and thus securely attach itself to the yarns. Also, many of the elements required for successful application (i.e. shower, vacuum slots and rolls, heat) are already present in the dryer section or can be readily adapted to this type of machine. In any event, the temperature of the environment in which the fabric is located must be sufficient so that the coating is cured in situ. Preferably, the temperature of the papermaking environment in which the fabric is located is in the range of from about 32° C. (90° F.) to about 120° C. (248° F.). More preferably, the temperature is in the range of from about 49° C. (120° F.) to about 93° C. (200° F.). Most preferably, the temperature is in the range of from about 60° C. (140° F.) to about 82° C. (180° F.).

Figure 3A:
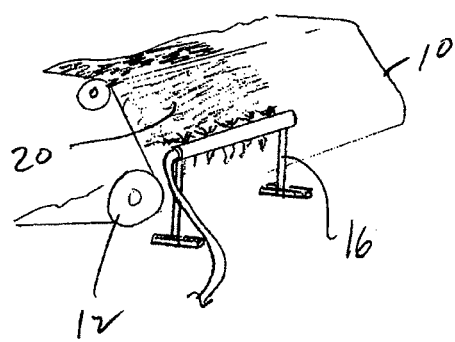
FIG. 3A is a perspective view of a spray boom having a size less than the width of the dryer fabric shown in a first position to coat a first portion of the fabric.
Figure 3B:
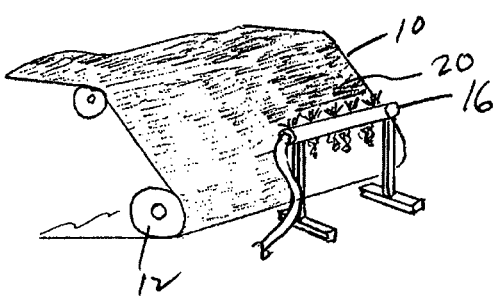
FIG. 3B is a perspective view of a spray boom having a size less than the width of the dryer fabric shown in a second position to coat a remaining portion of the fabric. This process could be used to treat just the edges of a fabric that was subject to contamination or hydrolysis on the edges and prevent premature removal of the fabric for problems outside of the sheet area.
Figure 4:
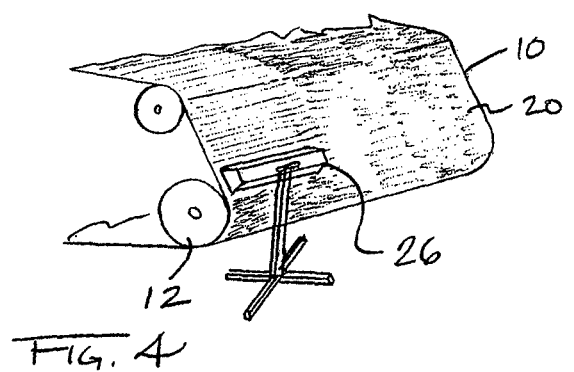
FIG. 4 is a perspective view of a portable heater shown in position for curing the coating applied to the fabric.

It is possible to cure the coating by any of a variety of heat treatment means, such as by use of a temporary bank of infrared heaters 26, as shown in FIG. 4. This coating equipment system can be designed as a portable unit that is self contained and could be either purchased and used within a paper mill or rented for the regeneration process. Additionally, as shown in FIGS. 3A and 3B, the equipment does not have to be full width of the machine 12 and could be moved across the width of the fabric 10 between passes to facilitate the coating process. For example, a first half of the fabric 10 can be coated with the spray boom 16 in a first position. The second half of the fabric 10 can then be coated with the spray boom 16 in a second position, as shown in FIG. 3B. Three or more passes could be utilized depending on the size of the spray boom 16 and the width of the fabric 10. Experience has shown that repeat applications (i.e. one application or layer spread over an existing one) do not adhere to one another so overlapping applications would not be a problem as they would be vacuumed off or otherwise removed by the downstream vacuum. This property of the coating eliminates the phenomenon of "windowpaning" whereby a thin film of coating would form and remain over a mesh opening, effectively blocking the mesh at one or more locations.

Alternatively, the apparatus could be designed or used to just coat the edges of the fabric to prevent the typical causes of premature fabric failure in this area, such as contamination by "stickies" and similar foreign matter in the paper web, and hydrolytic degradation of the component yarns at the fabric edges. We have found that, surprisingly, lateral edges of TAD fabrics which have been coated with the hydrophobic or oleophobic nanoparticle type contaminant resistant liquid solution/suspension and subsequently cured have remained relatively supple and do not exhibit typical signs of hydrolytic degradation when compared to similar but untreated fabrics.

The coating 20 with the nanoparticle surface treatment preferably includes both a hydrophobic and oleophobic characteristic. It is also possible to perform multiple coating and curing steps to form a composite coating on the fabric 10, for example, with a first coating layer having one of a hydrophobic or oleophobic characteristic, and a second or subsequent coating having the other of the hydrophobic or oleophobic characteristic, or another desired characteristic. This provides enhanced contamination resistance for the papermaking fabrics according to the invention.

Once the fabric has been successfully coated and the coating cured so that it is reasonably well bonded to the fabric surface and yarns, the coating equipment is removed from the machine and paper production resumed.

Figure 5:
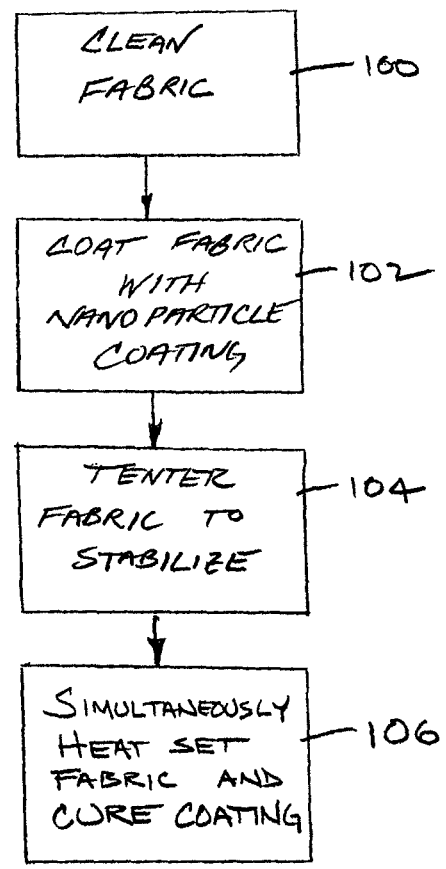
FIG. 5 is a block diagram illustrating a second embodiment of the process according to the invention for improving the contamination resistance properties of an industrial fabric used for papermaking by coating the fabric prior to heat setting and curing the coating during heat setting of the fabric.

According to a second embodiment of the invention, the fabric is treated during manufacture so as to render it contamination resistant by applying a hydrophobic and/or oleophobic water based nanoparticle type contaminant resistant coating, and then curing it so that the particulate matter adheres to the exposed surfaces of the fabric components. As shown in FIG. 5, box 100, the fabric is first cleaned using water and optionally a detergent or surfactant to remove any oils or impurities that may have become deposited on its surfaces during manufacture. Before the fabric is heatset so as to stabilize it, the clean fabric is coated, as indicated at box 102, by spraying, clip or lick coating, or other means such as are well known in the art and which may be used to provide a carefully controlled application of a hydrophobic and/or oleophobic water based nanoparticle type contaminant resistant liquid solution/suspension to one or both planar sides of the fabric. Preferably, both sides of the textile are so treated. Alternatively, only selected portions of the fabric, such as the lateral side edges, are so treated.

Presently preferred treatment materials comprise a water-based three-component system consisting of:

1. an adhesion promoter, which is preferably an organo-functional adhesion promoter having a functional group which is one of a vinyl-, methacrylate-, epoxy-, amino-, or mercapto-group;
2. a nanoparticulate material comprised of an organic prepolymer which is preferably comprised of organic nanoparticles such as nanowaxes, including polyethylene or polypropylene, or prepolymers of condensated silanes such as methyltriethoxysilane, propyltriethoxysilane, octyltrimethoxysilane, octyltriethoxysilane, or phenyltrimethoxysilane and the like, with one advantage provided by the use of the silane prepolymers being the possibility to react with the adhesion promoter to build a network of organic prepolymer; and
3. a fluorocarbon polymer, which is preferably a fluoroacrylate or fluoralkyl-polyurethane copolymer, although other similar fluorocarbon polymers may be suitable.

These three materials are combined in a ratio of from about 10-25% by weight adhesion promoter, 10-25% by weight nanoparticulate material, and from about 30-70% by weight fluorocarbon polymer to provide the desired three component system. Other coatings may also be utilized.

Following this application of the coating, the fabric is then heatset in the normal manner suitable for the textile. During the heatsetting process, the fabric will be exposed to temperatures in the range of from at least about 52° C. (125° F.), to about 204° C. (400° F.). Preferably the fabric will be heated to a temperature of from about 66° C. (150° F.) to about 177° C. (350° F.); more preferably this temperature will be from about 66° C. (150° F.) to about 149° C. (300° F.) which is sufficient to ensure curing and bonding of the surface treatment to the fabric components comprising at least a first surface of the textile. This requires that the fabric be tentered or otherwise stabilized by suitable means so as to maintain the dimensional stability of the fabric, as shown in box 104. The temperatures required for heat setting can be simultaneously used for curing the coating, as indicated at box 106.

It is presently preferred that the nanoparticle coating have both a hydrophobic and an oleophobic characteristic. However, it is also possible to perform multiple coating and curing steps, as outlined above, to form a composite coating on the fabric, for example, with a first coating layer having one of a hydrophobic or oleophobic characteristic, and a second or subsequent coating having the other of the hydrophobic or oleophobic characteristic, or another desired characteristic. This provides enhanced contamination resistance for the papermaking fabrics according to the invention. In any event, the fabric must be provided with a coating layer having one of a hydrophobic or oleophobic characteristic so as to provide effective contamination resistance properties to a fabric surface.

The fabric is then processed as usual so as to form a seam if necessary, seal its longitudinal edges and so on. If one or both surfaces of the fabric must be sanded or otherwise physically processed so as to render them monoplanar, then this is done prior to any application of the nanoparticle coating.

As previously mentioned, fabrics according to this invention may be coated following their installation on the papermaking machine for which they were intended, or they may be coated following their manufacture. It may be possible to coat the fabric in either case by means of several passes of different nanoparticle anti-contaminant systems so as to gain a composite with increased effectiveness and durability.

After installation on the papermaking machine 12, the fabric 10 can be recoated in accordance with the method of the first embodiment of the invention, as noted above. This can be done on the papermaking machine 12 without the need to remove the fabric 10, thus reducing down time and costs.

Relative Contamination Resistance (RCR) is an indicator of the ability of a fabric to resist contamination. RCR is measured by comparing a control fabric to a test fabric. In the test, a sample is cut from a larger fabric piece and is washed to remove any dust or grease. A similarly sized control sample is also prepared. A suitable length of double sided adhesive carpet tape is then hot pressed at a temperature of 85° C. (185° F.) and a pressure of 4448 N (1,000 lbs) for 1 min. duration across the narrow dimension of each of the test fabric and control surfaces. The tape is then peeled at an angle of 180° from the surfaces of each of the test and control samples using a CRE type tensile testing machine at a constant strain rate. The peel force required to remove the tape from the test sample is then compared to the peel force required to remove the tape from the control sample and is then expressed as a ratio (RCR). RCR numbers less than 1.0 indicate less contamination resistance than the control standard, while RCR numbers higher than 1.0 indicate better contamination resistance.

In laboratory experiments and papermaking machine trials, we have found that fabrics prepared in accordance with the teachings of this invention attained RCR values of from about 3 to about 14 in comparison to their untreated counterparts. This difference in RCR values occurred regardless of whether the coating was applied to the fabric on the papermaking machine in accordance with the first embodiment of the invention, or if it was applied at the time the fabric was heatset according to the second embodiment. We did find that coatings applied in accordance with the teachings of the second embodiment exhibited greater durability than coatings applied on the papermaking machine according to the first embodiment.

Fabrics which have been treated in accordance with the teachings of the present invention tend to release both water and oily contaminants more easily than do comparable, untreated fabrics. We have found that this improved propensity of the coated fabric to "give up" water more easily than a comparable untreated fabric can reduce the amount of energy necessary to dry equivalent amounts of paper by as much as 10% or more. Further, fabrics coated or recoated in accordance with the teachings of the present invention tend to run cleaner for longer periods of time when compared to similar, uncoated fabrics. A further observed benefit is that fabrics which have been coated with this material have reduced drag load in operation, with drag loads having been reduced by as much as 20% when compared to similar uncoated fabrics. Drag load refers to the load imposed on the drive mechanisms of the paper machine (and thus the amount of power required to drive the fabric at the desired speed) by the fabric due to the dewatering forces imposed by suction boxes and foils. Reduced drag loads mean reduced energy consumption which is very beneficial to mill operating costs. In addition, we have found that TAD fabrics whose lateral edges have been so treated appear to better resist hydrolytic degradation at these treated lateral edges when compared to similar but untreated fabrics.

While the preferred embodiments of the invention have been described in detail, the invention is not limited to the specific embodiments described above, which should be considered as merely exemplary. Further modifications and extensions of the present invention may be developed, and all such modifications are deemed to be within the scope of the present invention as defined by the appended claims.

The invention claimed is:

1. A woven industrial textile fabric, comprising:
   a woven mesh having first and second surfaces;
   at least one of a hydrophobic or oleophobic nanoparticle containing contaminant resistant coating bonded to at least one of the surfaces of the woven industrial textile fabric,
   the nanoparticle containing contaminant resistant coating consists essentially of: water as a base and
   (a) an adhesion promoter,
   (b) a nanoparticulate material comprised of organic nanoparticles, and
   (c) a fluorocarbon polymer; and
   the at least one surface of the woven industrial textile fabric exhibits a Relative Contamination Resistance ratio which is determined by measuring a peel force required to remove a tape from a sample and an uncoated fabric control and then forming a ratio of those values, in a range from 3 to 14.

2. The woven industrial textile fabric according to claim 1, wherein the adhesion promoter is an organo-functional adhesion promoter having a functional group which consists of:
   a) a vinyl group,
   b) a methacrylate group,
   c) an epoxy group,
   d) an amino group, or
   e) a mercapto group.

3. The woven industrial textile fabric according to claim 1, wherein the fluorocarbon polymer is at least one of:
   a) a fluoroacrylate, or
   b) a fluoroalkyl polyurethane copolymer.

4. The woven industrial textile fabric according to claim 1, wherein the organic nanoparticles comprise at least one of a nanowax or a prepolymer of condensated silanes.

5. The woven industrial textile fabric according to claim 4, wherein the prepolymer of condensated silanes include at least one of:
   a) methyltriethoxysilane,
   b) propyltriethoxysilane,
   c) octyltrimethoxysilane,
   d) octyltriethoxysilane, or
   e) phenyltrimethoxysilane.

6. The woven industrial textile fabric according to claim 1, wherein the nanoparticle containing contaminant resistant coating is cured to at least the paper side surface by heat treatment at a temperature from 125 F. to 400 F. to bond components of the nanoparticle containing contaminant resistant coating to the industrial textile fabric.

7. The woven industrial textile fabric according to claim 1, wherein the woven industrial textile fabric is a filtration fabric.

8. The woven industrial textile fabric according to claim 1, wherein the woven industrial textile fabric is a conveying fabric.

* * * * *

UNITED STATES PATENT AND TRADEMARK OFFICE
CERTIFICATE OF CORRECTION

PATENT NO. : 10,577,744 B2  
APPLICATION NO. : 15/425031  
DATED : March 3, 2020  
INVENTOR(S) : Baker et al.

Page 1 of 1

It is certified that error appears in the above-identified patent and that said Letters Patent is hereby corrected as shown below:

In the Specification

In Column 1, Line 9, delete "12/873,259, filed Sep. 1, 2017," and insert -- 12/873,359, filed Sep. 1, 2017, now U.S. Pat. No. 9,562,319, --, therefor.

In Column 1, Line 10, delete "2006," and insert -- 2006, now U.S. Pat. No. 7,811,627, --, therefor.

In Column 2, Line 3, delete "fabrics" and insert -- fabrics. --, therefor.

In Column 2, Line 16, delete "a either or" and insert -- either or --, therefor.

In Column 4, Line 49, delete "a slow or" and insert -- a "slow" or --, therefor.

In Column 5, Line 40, delete "machine" and insert -- machine. --, therefor.

In Column 5, Line 64, delete "(except" and insert -- except --, therefor.

In Column 7, Line 20, delete "clip" and insert -- dip --, therefor.

In Column 7, Line 45, delete "fluoralkyl-polyurethane" and insert -- fluoroalkyl-polyurethane --, therefor.

In the Claims

In Column 10, Line 35, in Claim 6, delete "125 F. to 400 F." and insert -- 125° F. to 400° F. --, therefor.

Signed and Sealed this  
Nineteenth Day of May, 2020

Andrei Iancu  
*Director of the United States Patent and Trademark Office*